US012455093B2

(12) United States Patent
Jamdade et al.

(10) Patent No.: US 12,455,093 B2
(45) Date of Patent: Oct. 28, 2025

(54) TIME-BASED ENERGY EFFICIENT SAFE MODE FOR FREECOOLING UNIT

(71) Applicant: Vertiv Corporation, Westerville, OH (US)

(72) Inventors: Amruta B. Jamdade, Chandannagar (IN); Rahul A. Gosavi, Pune (IN); Abhijeet V Deshmukh, Pune (IN)

(73) Assignee: Vertiv Corporation, Westerville, OH (US)

( * ) Notice: Subject to any disclaimer, the term of this patent is extended or adjusted under 35 U.S.C. 154(b) by 94 days.

(21) Appl. No.: 18/642,479

(22) Filed: Apr. 22, 2024

(65) Prior Publication Data

US 2024/0369254 A1 Nov. 7, 2024

(30) Foreign Application Priority Data

May 3, 2023 (IN) ............................. 202311031514

(51) Int. Cl.
*F24F 11/83* (2018.01)
*F24F 5/00* (2006.01)
(Continued)

(52) U.S. Cl.
CPC ............ *F24F 11/83* (2018.01); *F24F 5/0046* (2013.01); *F24F 11/32* (2018.01); *F24F 11/63* (2018.01);
(Continued)

(58) Field of Classification Search
CPC ........ F25B 25/005; F25D 17/02; F25D 16/00; F24F 11/32; F24F 11/63; F24F 11/83; F24F 5/0046; H05K 7/20709
See application file for complete search history.

(56) References Cited

U.S. PATENT DOCUMENTS 4,570,448 A * 2/1986 Smith ...................... F24F 11/74 165/251
5,276,630 A * 1/1994 Baldwin ............ G05D 23/1917 62/126
(Continued)

FOREIGN PATENT DOCUMENTS

CN 114198889 A 3/2022

OTHER PUBLICATIONS

European Search Report received in EP Application No. 24173675.0, Nov. 11, 2024, 13 pages.

*Primary Examiner* — Christopher R Zerphey
(74) *Attorney, Agent, or Firm* — Suiter Swantz IP

(57) ABSTRACT

A system and method for time-based safe mode operation of a multi-mode chiller device incorporating a freecooling system and a direct refrigeration system (e.g., wherein a fluid loop is circulated between the chiller device and a data center or similarly sensitive environment, from which the chilled water transfers heat before returning to the chiller device) senses ambient air temperatures outside the data center environment and return water (RW) temperatures (e.g., of water returning to the chiller from the environment) and engages the freecooling system based on a difference or delta between ambient and RW temperatures. If either the RW or ambient temperature sensors fail, preventing the freecooling system from engaging automatically, time-based safe mode is engaged wherein the freecooling and direct refrigeration systems are alternately engaged according to configuration time parameters adjustable by a user.

20 Claims, 5 Drawing Sheets

(51) Int. Cl.

| | |
|---|---|
| ***F24F 11/32*** | (2018.01) |
| ***F24F 11/63*** | (2018.01) |
| ***F25B 25/00*** | (2006.01) |
| ***F25D 17/02*** | (2006.01) |
| ***H05K 7/20*** | (2006.01) |

(52) U.S. Cl.

CPC ............ *F25B 25/005* (2013.01); *F25D 17/02* (2013.01); *H05K 7/20709* (2013.01)

(56) References Cited

U.S. PATENT DOCUMENTS

| | | | | |
|---|---|---|---|---|
| 6,640,561 | B2 * | 11/2003 | Roberto ................ | F25B 25/005 62/96 |
| 7,086,240 | B1 | 8/2006 | Zugibe et al. | |
| 7,434,413 | B2 * | 10/2008 | Wruck ..................... | F24F 11/62 165/251 |
| 8,128,379 | B2 | 3/2012 | Hritz | |
| 8,141,374 | B2 | 3/2012 | Hay | |
| 8,406,929 | B2 | 3/2013 | Duncan | |
| 8,515,584 | B2 | 8/2013 | Miller et al. | |
| 9,313,931 | B2 | 4/2016 | Goth et al. | |
| 9,930,812 | B2 | 3/2018 | Vaney et al. | |
| 9,982,903 | B1 * | 5/2018 | Ridder ..................... | F24F 11/70 |
| 10,426,064 | B2 | 9/2019 | Slessman et al. | |
| 11,175,076 | B2 * | 11/2021 | Kopko .................... | F25B 40/02 |
| 11,852,388 | B2 * | 12/2023 | Kniffler ................. | F25B 25/005 |
| 2012/0290135 | A1 | 11/2012 | Bentivegna et al. | |
| 2019/0327861 | A1 * | 10/2019 | Duncan .............. | H05K 7/20827 |

* cited by examiner

TIME-BASED ENERGY EFFICIENT SAFE MODE FOR FREECOOLING UNIT

CROSS-REFERENCE TO RELATED APPLICATIONS

This application claims priority under 35 USC § 365 to prior filed Indian provisional patent application 202311031514 filed May 3, 2023. Said Indian provisional patent application 202311031514 is hereby incorporated by reference in its entirety.

TECHNICAL FIELD

The present disclosure is directed to systems and methods for temperature regulation within a data center or similarly sensitive enclosed space.

BACKGROUND

Chiller systems help to regulate temperature within a data center or similar enclosed space wherein sensitive information technology (IT) equipment operates. In particular, various types of liquid-cooled or air-cooled chillers remove heat generated by IT equipment within the data center by transferring heat outside the data center. Multi-mode chiller systems may attempt to operate with maximum efficiency (e.g., by minimizing power usage effectiveness (PUE), or the ratio of total energy required to support a data center over the amount of energy consumed by the IT equipment supported therein; also partial PUE (pPUE), or a portion of overall PUE within a bounded subset of the data center) and minimal consumption of electricity and water supplies by regulating temperature and/or humidity by selecting from a set of cooling subsystems as environmental conditions demand.

For example, multi-mode computer room air handler (CRAH; also computer room air conditioner (CRAC)) units circulate chilled water through a coil within the data center, wherein air is driven (e.g., by fans) through the coil to transfer heat from the air to the chilled water. The heated water returns from the data center to an external chiller system where the transferred heat is removed (and the water re-chilled) for the next chilling cycle. A direct refrigeration system may provide for chilling water in the loop through a conventional refrigeration cycle. Multi-mode chiller systems, however, may supplement the direct refrigeration system with freecooling. For example, when ambient temperatures are sufficiently low, freecooling systems may activate to chill the water cycle using external air, without the need for activation of the direct refrigeration system. In generally cooler climates (e.g., Northern Europe), freecooling systems may provide a comparable degree of cooling without the use of compressors for a majority of an average year. Even in warmer regions such as the Middle East, however, freecooling may be available for a significant portion of the year.

Multi-mode systems depend on temperature sensors to determine when environmental conditions are appropriate to switch from direct refrigeration to freecooling. For example, negative temperature coefficient (NTC) thermistors are often used as inrush current limiters and temperature sensors. When these thermistors fail, however, the chiller system cannot effectively determine when conditions are appropriate for freecooling. As a result, until the thermistors can be serviced and/or replaced, the chiller system must default to less efficient direct refrigeration, even where conditions may support the switch to freecooling.

SUMMARY

In a first aspect, a controller device for a multi-mode chiller system (e.g., a chiller system including both direct refrigeration (DX) and freecooling (FC) subsystems, one or both subsystems configured for removing heat from a data center environment or like enclosed space) is disclosed. In embodiments, the controller device includes control processors as well as memory/data storage for storing processor-executable encoded instructions, threshold conditions for activating the FC system, and configuration time parameters adjustable by an end user (e.g., via a control interface). The chiller system includes a water loop circulating through the data center environment and configured to remove heat therefrom (e.g., by driving air over water (or another appropriate fluid) circulating through coils chilled by the DX and/or FC systems). For example, the DX system may be the default chiller subsystem, cooling the water loop via a full refrigeration cycle, whereas the FC directs ambient air over the water loop via a fan, without mechanical refrigeration. The controller device monitors ambient temperatures sensed by an ambient temperature sensor and return water temperatures (RWT; e.g., water returning to the chiller system from the data center via the water loop) sensed by an RWT sensor in order to determine whether threshold conditions are met for engaging the FC system (e.g., ambient temperatures outside the data center cooler than water returning from the data center via the water loop for a sustained period of time). The controller device likewise monitors the ambient and RWT sensors for a failure in either sensor, which would otherwise preclude the automatic engagement of the FC system. When a failure is detected in either sensor, the controller device engages a time-based safe mode whereby the FC and DX systems are engaged based on the configuration time parameters.

In some embodiments, the chiller system may engage a hybrid cooling mode wherein the DX system and FC system operate simultaneously (although either system may be engaged at less than full capacity).

In some embodiments, configuration time parameters provide for a recurring activation cycle, e.g., wherein the FC system is engaged for a first duration (e.g., X minutes, X minutes per cycle) and the DX system is then engaged for a second duration (e.g., Y minutes, Y minutes per cycle).

In some embodiments, the first duration (e.g., X minutes) is greater than the second duration (e.g., Y minutes).

In some embodiments, the first duration (e.g., X minutes) is an integer multiple of the second duration (e.g., Y minutes).

In some embodiments, the RWT sensor is disposed within a return portion of the water loop (e.g., wherein warmer water returns to the DX and/or FC systems from the data center environment) and the controller receives a leaving water temperature (LWT) sensed by an LWT sensor in a leaving portion of the water loop (e.g., wherein chilled water leaves the DX and/or FC systems for the data center environment). Based on the sensed LWT, the controller adjusts the speed or one or more fans for increased or decreased air circulation.

In some embodiments, the controller includes a control interface for receiving control input from a user and for setting the configuration time parameters (e.g., based on the received control input.

In some embodiments, the control interface displays system parameters and/or settings (e.g., including the current configuration time parameters) to the user.

In a further aspect, a multi-mode chiller device for removing heat from a data center or like enclosed space is disclosed. In embodiments, the chiller unit includes a water loop for circulating chilled water to and from the data center (e.g., wherein returning water is warmer than water leaving the chiller system). The chiller unit includes a freecooling (FC) system, e.g., wherein a refrigerant fluid is pumped through freecooling coils and chilled by fans without mechanical refrigeration; the chilled water returns to the chiller system and cools the water loop. The chiller unit also includes a direct refrigeration (DX; e.g., mechanical refrigeration) system whereby a refrigerant fluid is pumped through a mechanical refrigeration cycle (e.g., evaporator, compressor, condenser, expansion valve) and returned to the chiller system to cool the water loop (e.g., by directing air over the chilled refrigerant and proximate to the water loop). The chiller system includes an ambient temperature sensor for determining ambient air temperatures outside the data center. The chiller system includes a return water temperature (RWT) sensor for determining a temperature of water returning to the chiller system from the data center. The chiller system includes a controller device for engaging the DX and/or FC systems; for example, the chiller may operate in DX/mechanical refrigeration mode on a default basis but may engage the FC system instead when threshold conditions are met (e.g., when ambient temperatures are sufficiently cooler than return water temperatures). The controller device monitors the temperatures sensed by the ambient and RWT sensors (e.g., for automatic engagement of the FC system) as well as the status of the sensors themselves. If either the ambient or RWT sensor fails (thus precluding automatic engagement of freecooling mode), the controller device engages a time-based safe mode whereby the FC and DX systems are engaged according to user-determined configuration time parameters.

In some embodiments, the chiller unit includes a leaving water temperature (LWT) sensor in the water loop, for determining a temperature of chilled water leaving the chiller for the data center environment. For example, fan speed (e.g., for fans directing air over freecooling coils of the FC system, condenser coils of the DX system, and/or the water loop) may be determined in part based on the sensed leaving water temperature.

In some embodiments, the chiller system may engage a hybrid cooling mode wherein the DX system and FC system operate simultaneously (although either system may be engaged at less than full capacity).

In some embodiments, configuration time parameters provide for a recurring activation cycle, e.g., wherein the FC system is engaged for a first duration (e.g., X minutes) and the DX system is then engaged for a second duration (e.g., Y minutes).

In some embodiments, the first duration (e.g., X minutes) is at least one of greater than the second duration (e.g., Y minutes).

In some embodiments, the first duration (e.g., X minutes) is an integer multiple of the second duration (e.g., Y minutes).

In some embodiments, the chiller system includes a control interface for receiving control input from a user, whereby system settings or parameters (e.g., configuration time parameters) may be displayed to the user, and whereby the controller may adjust system settings or parameters (e.g., configuration time parameters), based on control input received from the user.

In a still further aspect, a method for multi-mode temperature regulation within a data center or like enclosed space is disclosed. In embodiments, the method includes providing a multi-mode chiller system whereby a water loop circulates to and from the data center environment, the chiller system including a direct refrigeration (DX; e.g., mechanical refrigeration) system for cooling the water loop by circulating a refrigerant through a full refrigeration cycle and a freecooling (FC) system for cooling the water loop by circulating a refrigerant through FC coils where the refrigerant is chilled by ambient air and returned to the chiller system to cool the water loop. The method includes receiving configuration time parameters set by a user (e.g., or predetermined parameters stored to memory) via a control interface. The method includes sensing an ambient air temperature outside the data center via an ambient temperature sensor. The method includes sensing, via a return water temperature (RWT) sensor, a temperature of water recirculating to the chiller system from the data center via the water loop). The method includes determining a delta between the ambient and RWT temperatures. The method includes, when the delta meets or exceeds a threshold level (e.g., when ambient air is sufficiently cooler than return water for a threshold duration), engaging the FC system in place of the default DX system. The method includes detecting a failure of either the RWT or ambient temperature sensors. The method includes, when a failure is detected in either sensor, engaging a time-based safe mode of the chiller system. The method includes, when the time-based safe mode is engaged, alternately engaging the FC and DX systems according to the current configuration time parameters.

In some embodiments, the method includes engaging, while the time-based safe mode is engaged, a recurring activation cycle wherein the FC system is engaged for a first duration (e.g., X minutes) and then the DX system is engaged for a second duration (e.g., Y minutes).

In some embodiments, the method includes engaging a hybrid cooling mode wherein the DX system and FC system operate simultaneously (although either system may be engaged at less than full capacity).

In some embodiments, the first duration (e.g., X minutes) is at least one of greater than the second duration (e.g., Y minutes) or an integer multiple of the second duration (e.g., Y minutes).

In some embodiments, the method includes sensing a leaving water temperature (LWT) via an LWT sensor located in the water loop between the DX and FC systems and the data center environment (e.g., wherein chilled water is leaving the DX/FC systems for the data center environment). The method includes increasing or decreasing at least one fan speed, via the controller, based on the received LWT.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
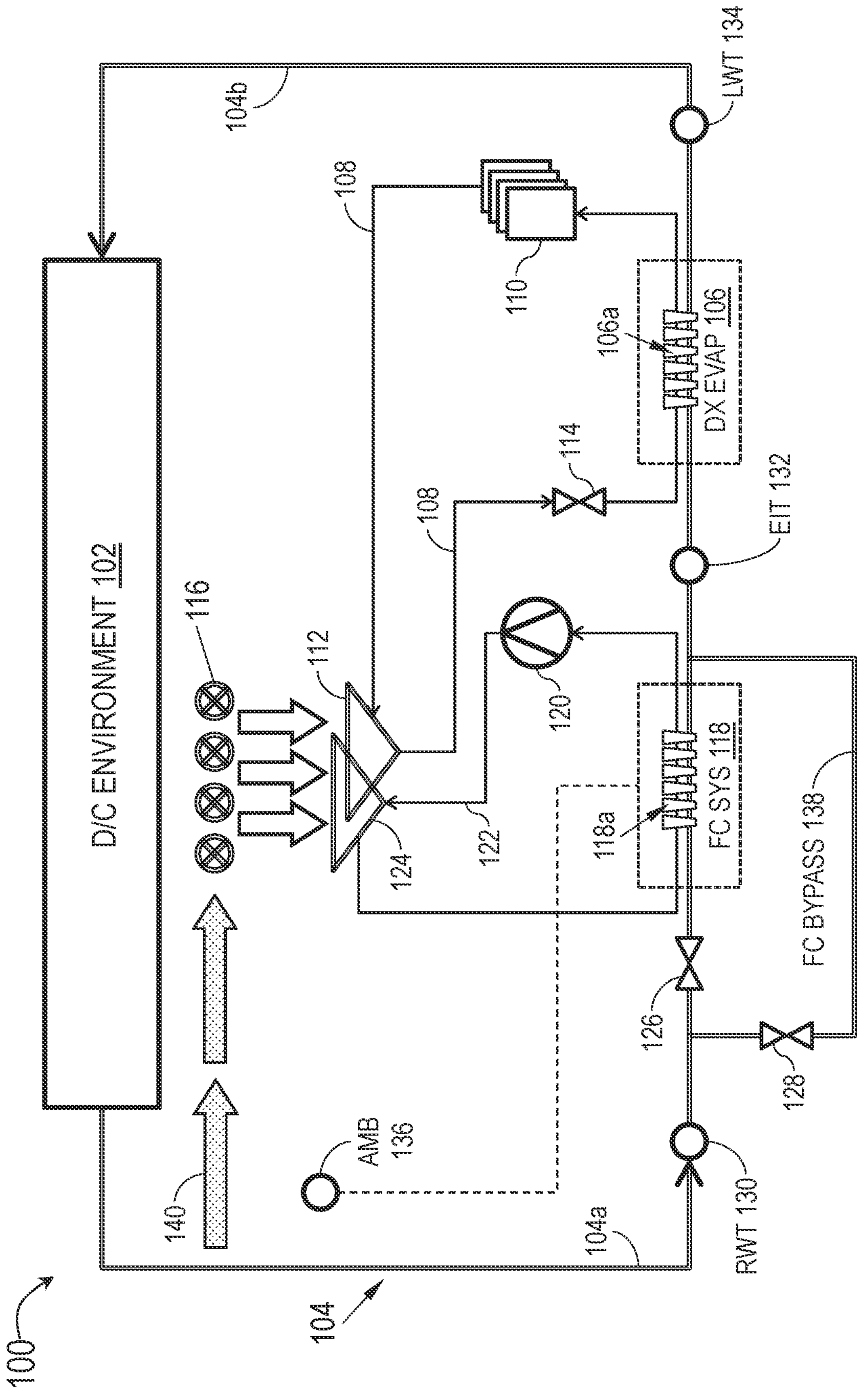
FIG. 1 is a schematic diagram of a multi-mode chiller system for a data center environment incorporating direct refrigeration (DX) and freecooling (FC) systems according to example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Broadly speaking, embodiments of the inventive concepts disclosed herein are directed to a system and method for energy-efficient multi-mode cooling (e.g., via a chilled-water computer room air handler (CRAH)) system incorporating a time-based safe mode when temperature sensors fail. For example, when the chiller system cannot determine when conditions support the use of freecooling over direct refrigeration, the system may automatically switch to freecooling based on time-based parameters predetermined by a user until temperature sensors can be restored.

Referring to FIG. 1, a multi-mode chiller system 100 is shown.

In embodiments, the chiller system 100 may circulate chilled water (e.g., or another appropriate working fluid) through a data center (D/C) environment 102 (or like enclosed space where temperature and/or humidity regulation may be needed) via a water loop 104 (e.g., fluid loop). For example, water (or any other appropriate working fluid) transported by the water loop 104 may be chilled prior to entering the data center environment 102 by a direct refrigeration (DX; mechanical cooling) system including evaporator 106, refrigeration circuit 108, compressor/s 110, condenser coils 112, expansion valve 114 (e.g., EV; electronic expansion valve (EEV)). and fans 116. The chiller system 100 may further include a freecooling (FC) system 118 including FC pump 120, FC circuit 122, FC coils 124, FC valve 126, and FC bypass valve 128. The chiller system 100 may further include, within the water loop 104, return water temperature (RWT) sensor 130, evaporator inlet temperature (EIT) sensor 132, and leaving water temperature (LWT) sensor 134. The chiller system 100 may further include ambient temperature sensor 136 (AMB; e.g., located external to the data center environment 102 for sensing ambient air temperature and/or humidity outside the data center).

In embodiments, water returning via the water loop 104 from the data center environment 102 (e.g., and warmed by heat transferred from the data center environment) to the FC system 118 or the DX system (e.g., via a first portion 104*a*, or a return portion, of the water loop 104) may be rechilled (e.g., to transfer from the water loop heat removed from the data center environment) by the DX system, whereby a refrigerant (e.g., a water/glycol mixture or any other appropriate working fluid) is circulated through the DX refrigeration circuit 108 and undergoes a refrigeration cycle such that a low temperature/low pressure mixture of liquid and vapor may return to the evaporator 106 via the EV 114, absorbing transferred heat from the water loop 104 (e.g., and re-chilling the water within). In embodiments, the chiller system 100 may circulate this re-chilled water (or another appropriate fluid) through the water loop 104 from the FC system 118 or the DX system to the data center environment 102 (e.g., through a second portion 104*b*, or a leaving portion, of the water loop). For example, the re-chilled water may be recirculated through the data center environment 102 via the water loop 104, repeating the cycle.

In embodiments, the chiller system 100 may operate in a default mode wherein the water loop 104 is chilled by the DX system (e.g., via heat exchangers 106*a* within, or proximate to, the DX evaporator 106) and the closed FC valve 126 and open bypass valve 128 allow the water loop to bypass (138) the FC system 118. For example, within the water loop 104 the RWT sensor 130 may be disposed within or near the flow of, and report the temperature of, water returning to the chiller system from the data center environment 102. Similarly, the EIT sensor 132 may report the temperature of water entering the DX system (e.g., and leaving the FC system 118, if the FC system is currently engaged) and the LWT sensor 134 may be disposed within or near the flow of, and report the temperature of, water leaving the DX system (and the chiller system 100 generally) en route to the data center environment 102.

In embodiments, when ambient environmental conditions external to the data center environment 102 are sufficiently favorable (e.g., where ambient air temperatures outside the data center environment are sufficiently cooler than water returning to the chiller system 100 via the water loop 104 (e.g., return water temperature)), the chiller system may operate in a freecooling mode whereby the water loop is partially or fully chilled by the FC system 118 (e.g, wherein the FC valve 126 remains open and the FC bypass valve 128 remains closed), increasing the overall efficiency of the chiller system by providing equivalent or greater cooling power with reduced consumption of electricity and/or water. For example, the chiller system 100 may operate in a hybrid mode wherein the water loop 104 is simultaneously chilled by both the FC system 118 and the DX system prior to circulation into the data center environment 102. While the hybrid mode is engaged, with respect to the DX system fewer compressors 110 may be in operation than if only the DX system was engaged. Similarly, the fans 116 may run at a lower speed in hybrid mode than if only the DX system was engaged. In embodiments, within the FC system 118 the FC pump 120 may circulate a refrigerant (e.g., a water/glycol mixture or like appropriate working fluid) through the FC circuit 122 and the FC coils 124, wherein ambient airstreams 140 external to the data center environment 102 are directed by the fans 116 across the FC coils to chill the refrigerant therein. The chilled refrigerant may be recirculated by the FC system 118 to heat exchangers **118*a* proximate to the water loop 104, via which warmed water returning from the data center environment 102 may be re-cooled (118*a***).

Alternatively, in some embodiments the chiller system 100 may operate in a full freecooling mode whereby the water loop 104 is chilled exclusively via the FC system 118 prior to circulation through the data center environment 102, and wherein the DX system is fully disengaged. For example, one or more fans 116 within the chiller system 100 (e.g., and configured for joint use by the FC system 118 and the DX system) may run at higher or lower speeds based on the leaving water temperature sensed by the LWT sensor 134 (e.g., chilled water leaving the FC system for the data center environment 102 via the water loop 104).

In embodiments, the chiller system 100 may monitor the ambient temperature determined by the AMB sensor 136 and the return water temperature determined by the RWT sensor 130 in order to monitor the difference, or delta, between the two temperatures and whether environmental conditions (e.g., ambient temperatures significantly cooler than the return water temperature) support a switch to partial or full freecooling. For example, if the delta between the ambient air temperature and return water temperature meets or exceeds a threshold level, e.g., if the ambient air temperature outside the data center environment 102 is 3.5 degrees C. less than the return water temperature of warmed water returning from the data center environment via the water loop 104 for at least 60 consecutive seconds, the FC system 118 may be engaged. Similarly, the DX system may be powered down (e.g., for partial freecooling mode or hybrid cooling mode) or disengaged entirely (e.g., for full freecooling mode). In embodiments, the precise parameters governing freecooling logic and automatic engagement of the FC system 118 may likewise be adjusted by a user.

In some embodiments, either or both of the AMB sensor 136 or the RWT sensor 130 may fail. For example, the likelihood of failure in either the AMB sensor 136 or the RWT sensor 130 may vary depending on the types of thermistors underlying each temperature sensor (e.g., bead, disk, rod). If either the AMB sensor 136 or the RWT sensor 130 is in a failure state, however, the affected sensor/s are incapable of reporting accurate temperature information and the chiller system 100 (e.g., freecooling logic therein) may be unable to accurately determine when environmental conditions currently exist that support the activation of the FC system 118. For example, the chiller system 100 may maintain full performance via exclusive use of mechanical cooling via the DX system until the affected RWT and/or AMB temperature sensors 130, 136 can be repaired and/or replaced. However, operation under full mechanical-cooling mode (e.g., DX only) may result in significantly higher consumption of electricity and/or water relative to the optimal efficiency of the chiller system 100, e.g., whereby the chiller system 100 can switch to partial or full cooling via the FC system 118 when conditions support doing so.

Figure 2:
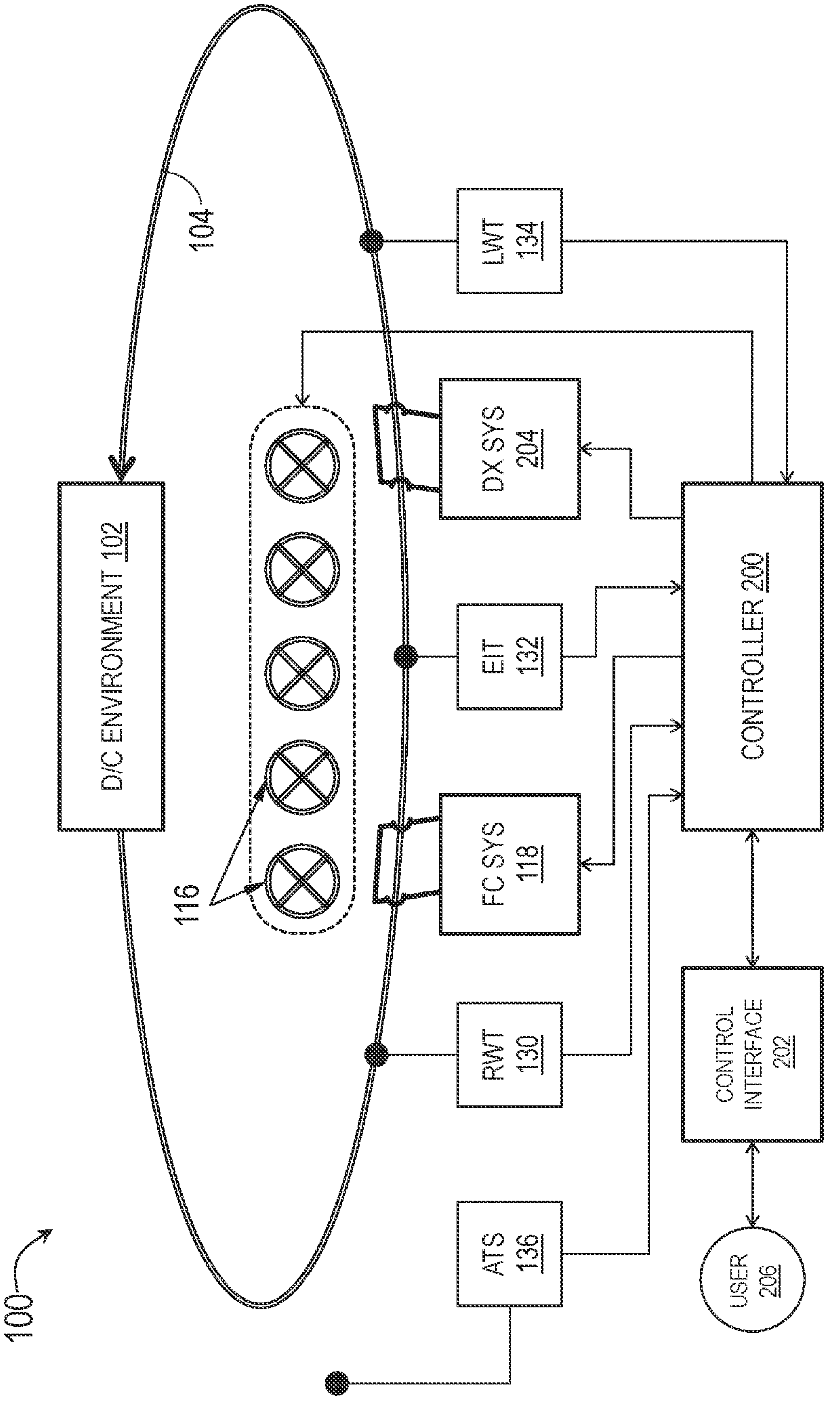
FIG. 2 is a block diagram illustrating components and operations of the multi-mode chiller system of FIG. 1.

Referring now to FIG. 2, the chiller system 100 may include controller 200, control interface 202, freecooling system 118 (including, e.g., FC pump 120, FC circuit 122, FC coils 124, FC valve 126, and FC bypass valve 128 (FIG. 1)), and direct refrigeration/mechanical cooling (DX) system 204 (including, e.g., evaporator 106, refrigeration circuit 108, compressor/s 110, condenser coils 112, expansion valve 114 (FIG. 1)).

In embodiments, the controller 200 may include one or more processors for controlling the operation of the FC system 118 and/or DX system 204, and memory or other like appropriate data storage for storing system parameters, system settings, and/or executable instructions. For example, the controller 200 may receive and monitor temperatures sensed at various stages of the water loop 104, adjusting operations of the chiller system 100 accordingly. For example, as noted above, the controller 200 may receive ambient air temperatures sensed by the AMB sensor 136 and return water temperatures within the water loop 104 (e.g., wherein warmed water returns to the chiller system 100 from the data center environment 102) sensed by the RWT sensor 130, monitoring the delta (e.g., difference) between the two temperatures. Further, in embodiments the controller 200 may include accurate clocks monitoring the current time as well as elapsed times associated with a particular operating mode or condition, whether internal or external (e.g., amount of time the chiller system 100 has been operating in each available mode, amount of time since the FC system 118 was last activated).

In embodiments, when the delta between the ambient air and return water temperatures meets or exceeds a predetermined threshold level, the controller 200 may partially or fully engage the FC system 118 and partially or fully disengage the DX system 204, transitioning from a full mechanical operating mode to a hybrid/partial freecooling mode or to a full freecooling mode. For example, if the delta between ambient air and return water temperatures drops below the threshold level, the controller 200 may transition back to full mechanical mode, disengaging and bypassing (138, FIG. 1) the FC system 118.

Further, the controller 200 may receive the leaving water temperature (e.g., setpoint temperature) sensed by the LWT sensor 134 at a different part of the water loop 104 (e.g., where chilled water leaves the chiller system 100 for the data center environment 102), and may increase or decrease the speed of one or more fans 116 serving the FC system 118 and/or DX system 204. For example, if the leaving water temperature is insufficiently cool, the controller 200 may increase the speed of one or more fans 116 for increased cooling of the water loop 104 via the FC system 118 and/or DX system 204.

In embodiments, the control interface 202 may provide a display unit whereby settings and parameters of the chiller system 100 may be displayed to a user 206. Further, the control interface 202 may include an interactive display (e.g., buttons, switches, interactive touchscreen) via which the user 206 may provide control input to the controller. For example, via the control interface 202 the user 206 may monitor or set the current operating mode (e.g., overriding automatic selection of the current operating mode by the controller 200), view sensed temperatures and/or system settings (e.g., current speeds at which the fans 116 are operating), and set system parameters.

In embodiments, the user 206 may (via the control interface 202) set configuration time parameters defining the engagement of a safe operating mode if failures are detected in one or more temperature sensors. For example, as noted above the automatic transition between operating modes by the controller 200 (e.g., from full mechanical mode to hybrid mode or full freecooling mode) may depend on temperatures sensed by the AMB sensor 136 and RWT sensor 130, and a determined delta between the sensed temperatures which defines whether conditions exist to support transition to a freecooling mode.

In embodiments, if the controller 200 detects a failure mode in either the AMB sensor 136 or the RWT sensor 130, the controller 200 may transition from the current operating mode to a safe operating mode. For example, safe mode operations may continue until adjusted by a user 206 via the control interface 202 or until the affected sensor/s are repaired or replaced (e.g., such that the controller 200 resumes receipt of current temperature information from both sensors).

In embodiments, when the chiller system 100 is transitioned to safe mode, chilling operations may be time-based to conserve electricity and/or water consumption while maintaining the necessary temperature and/or humidity conditions within the data center environment 102. For example, when the chiller system 100 is transitioned to safe mode the controller 200 may transition between full mechanical mode, hybrid mode, and/or full freecooling mode based on configuration time parameters set by the user 206.

In embodiments, configuration time parameters may determine that the chiller system 100 runs in full mechanical mode on a default basis and transitions, fully or partially, to freecooling mode for a certain amount of time every hour or day, e.g., overnight or when atmospheric and weather trends suggest conditions supporting the use of freecooling are most likely to occur. In some embodiments, when the time-based safe mode is engaged, the controller 200 may transition between freecooling mode (e.g., full/partial/hybrid) and mechanical mode according to configuration time parameters either predetermined by the controller or adjusted by a user 206 (e.g., via the control interface 202). For example, when time-based safe mode is engaged, the chiller system 100 may run according to a recurring activation cycle whereby the controller 200 engages the FC system 118 for a set duration (e.g., X minutes, where X is a positive number), then disengages the FC system and engages the DX system 204 for another set duration (e.g., Y minutes, where Y is a positive number). The activation cycle thus concluded, the controller 200 may disengage the DX system 204 and re-engage the FC system 118 for the next activation cycle. For example, the time-based safe-mode may provide for a recurring 30-minute activation cycle wherein the controller 200 first engages the FC system 118 for a 20-minute duration and then engages the DX system 204 for a 10-minute duration. In some embodiments, the second duration for which the DX system 204 is engaged may be a fraction of the first duration for which the FC system 118 is engaged (e.g., or the first duration may be an integer multiple of the second duration, e.g., engagement of the FC system for 15 minutes followed by engagement of the DX system for 7.5 minutes (7 minutes, 30 seconds). For example, the first and second durations, and/or the relationship between the first and second durations, may be adjusted by the user 206 via the control interface 202, e.g., to account for climatic conditions local to the data center environment 102.

Figure 3A:
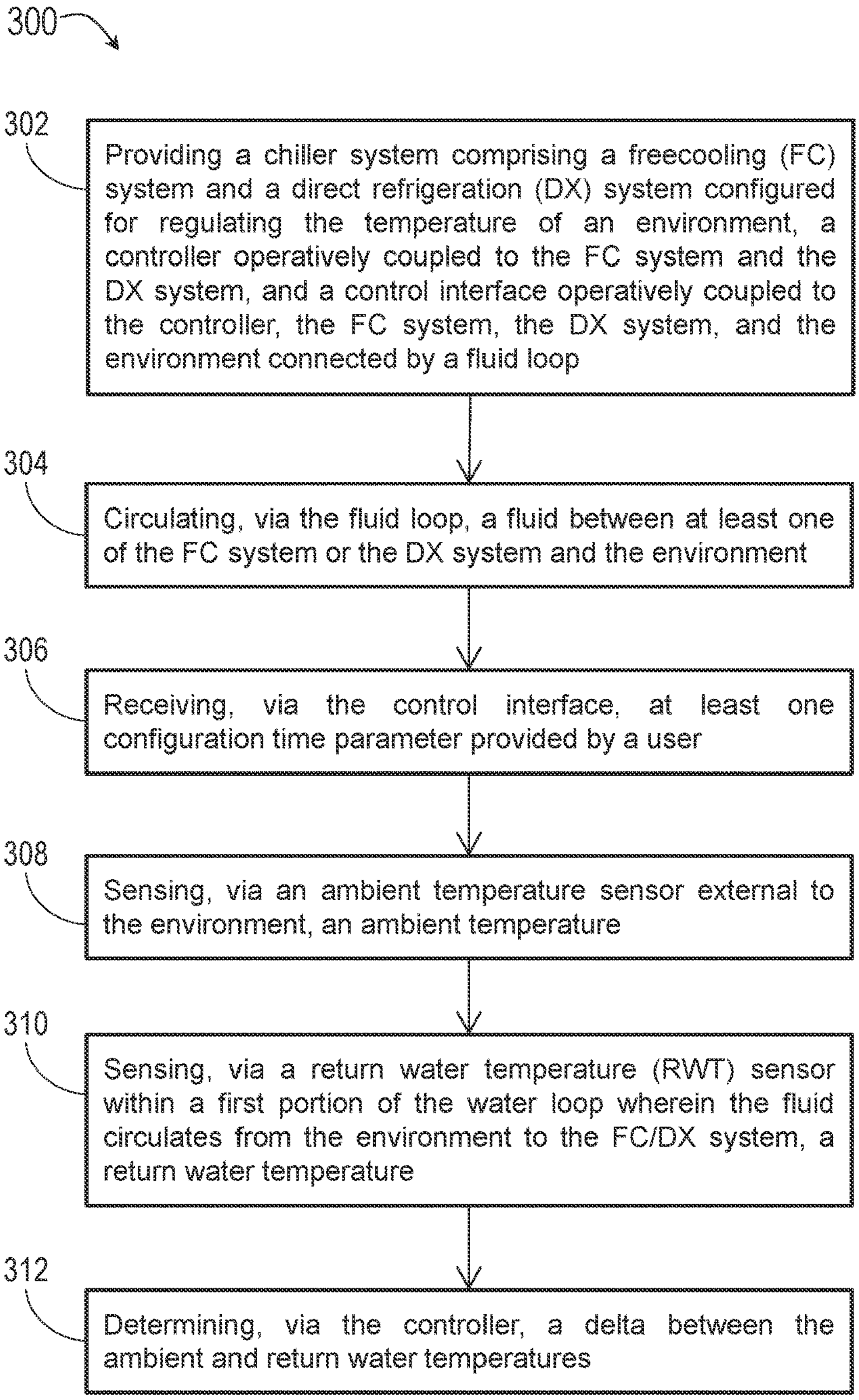
FIGS. 3A through 3C are process flow diagrams illustrating a method for multi-mode temperature regulation within an environment according to example embodiments of this disclosure.

Referring now to FIG. 3A, a method 300 for multi-mode temperature regulation within a data center environment may be implemented by the chiller system 100 and may include the following steps.

At a step 302, a chiller system is provided for regulating the temperature and/or humidity within a data center environment or like sensitive enclosed space, e.g., via removing excess heat from said environment. For example, the chiller system may include a direct refrigeration (DX; mechanical cooling) system and a freecooling (FC) system, a controller capable of operating and adjusting the DX and FC systems, a control interface for displaying control parameters and accepting control input from a user, and a water loop for circulating water cooled by the chiller system to and from the environment.

At a step 304, water (or other appropriate fluid) is circulated between the FC system and DX systems and the data center environment via the fluid loop. For example, a first or return portion of the fluid loop may circulate warmer water from the data center environment back to the FC and DX systems for rechilling. Similarly, a second or leaving portion of the fluid loop circulates chilled water from the FC and DX systems to the data center environment.

At a step 306, the chiller system receives configuration time parameters from a user via the control interface. For example, the user may input or adjust configuration time parameters to optimize efficient operation of the chiller system while operating in safe mode.

At a step 308, an ambient temperature (AMB) sensor senses an ambient air temperature (e.g., and or humidity) external to the environment (e.g., outdoors), reporting the sensed temperature to the controller.

At a step 310, a return water temperature (RWT) sensor within the water loop (e.g., within the first or return portion) senses a temperature of warmed water returning to the chiller system from the environment (e.g., and carrying heat transferred from the environment), reporting the sensed temperature to the controller.

At a step 312, the controller determines a delta, or difference, between the sensed ambient and return water temperatures.

Figure 3B:
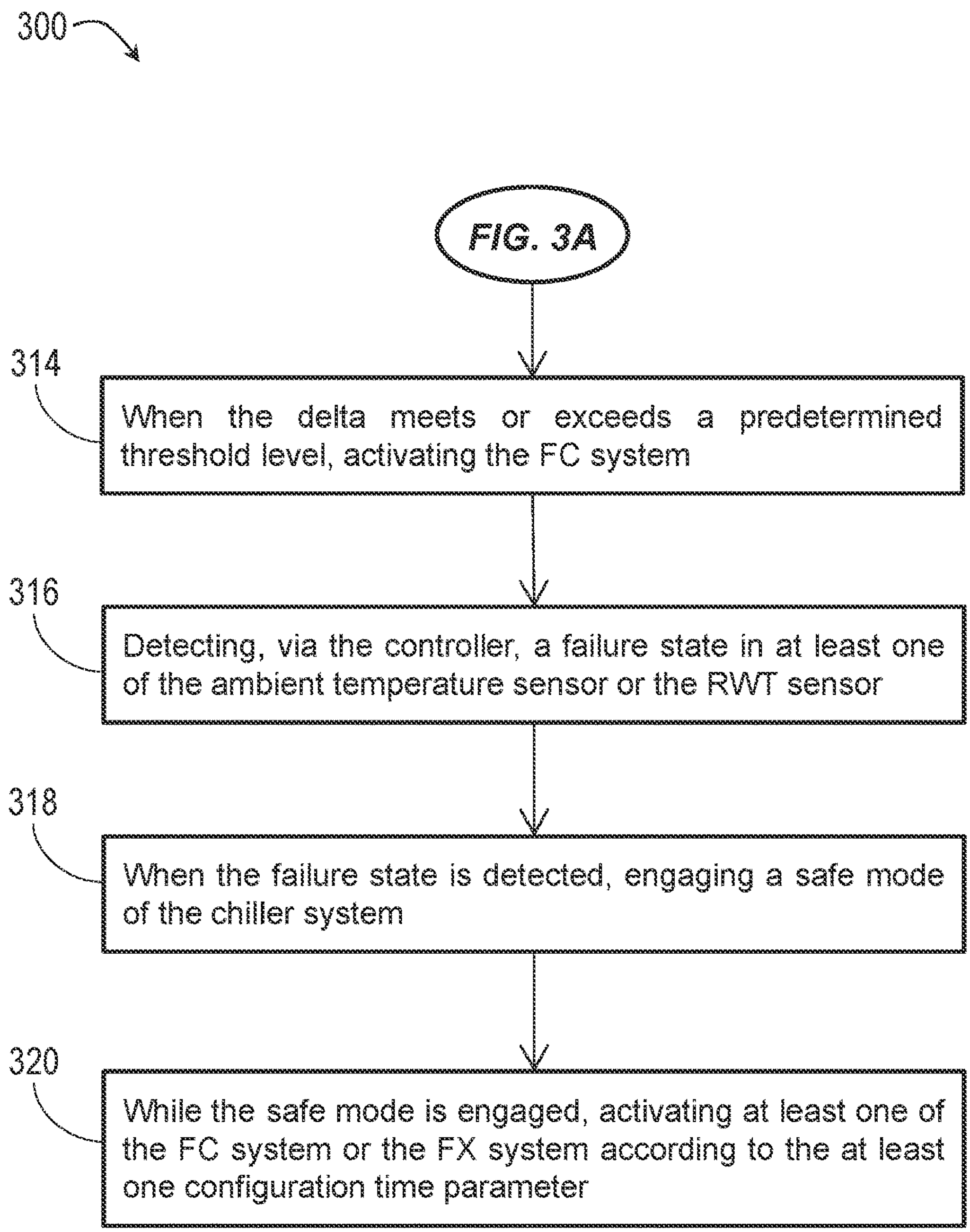

Referring now to FIG. 3B, at a step 314, when the delta meets or exceeds a predetermined threshold level, the controller activates the freecooling system. For example, the controller may transition the chiller system from a full mechanical mode, e.g., wherein the water loop is cooled solely by the DX system (bypassing the FC system), to a hybrid mode wherein the water loop passes through, and is chilled by, both the FC system and the DX system (either of which may be operating at full or partial capacity). In some embodiments, the chiller system may be transitioned to a full freecooling mode, whereby the water loop is cooled exclusively by the freecooling system and the DX system is disengaged.

At a step 316, the controller detects a failure state in either or both of the AMB sensor or the RWT sensor, such that the freecooling logic of the controller would otherwise be unable to determine when atmospheric conditions (e.g., sufficiently low ambient temperatures outside the enclosed environment) exist that support the use of partial or full freecooling.

At a step 318, when the failure mode is detected (e.g., and until the failing sensors are repaired or replaced), the chiller system transitions from the current operating mode to a time-based safe operating mode.

At a step 320, while the time-based safe mode is engaged, the controller adjusts or activates one or both of the FC and DX systems according to the configuration time parameters entered or set by the user via the control interface. For example, the configuration time parameters may provide for a recurring activation cycle whereby the chiller system first engages the FC system for a first time duration (e.g., X minutes), and then engages the DX system (and disengages the FC system) for a second time duration (e.g., Y minutes). In some embodiments, the first duration (e.g., X minutes) is an integer multiple of the second duration (e.g., Y minutes) and/or is greater than the second duration. For example, the activation cycle may be a 30-minute cycle wherein the FC system is engaged for 20 minutes and then the DX system is engaged for 10 minutes.

Figure 3C:
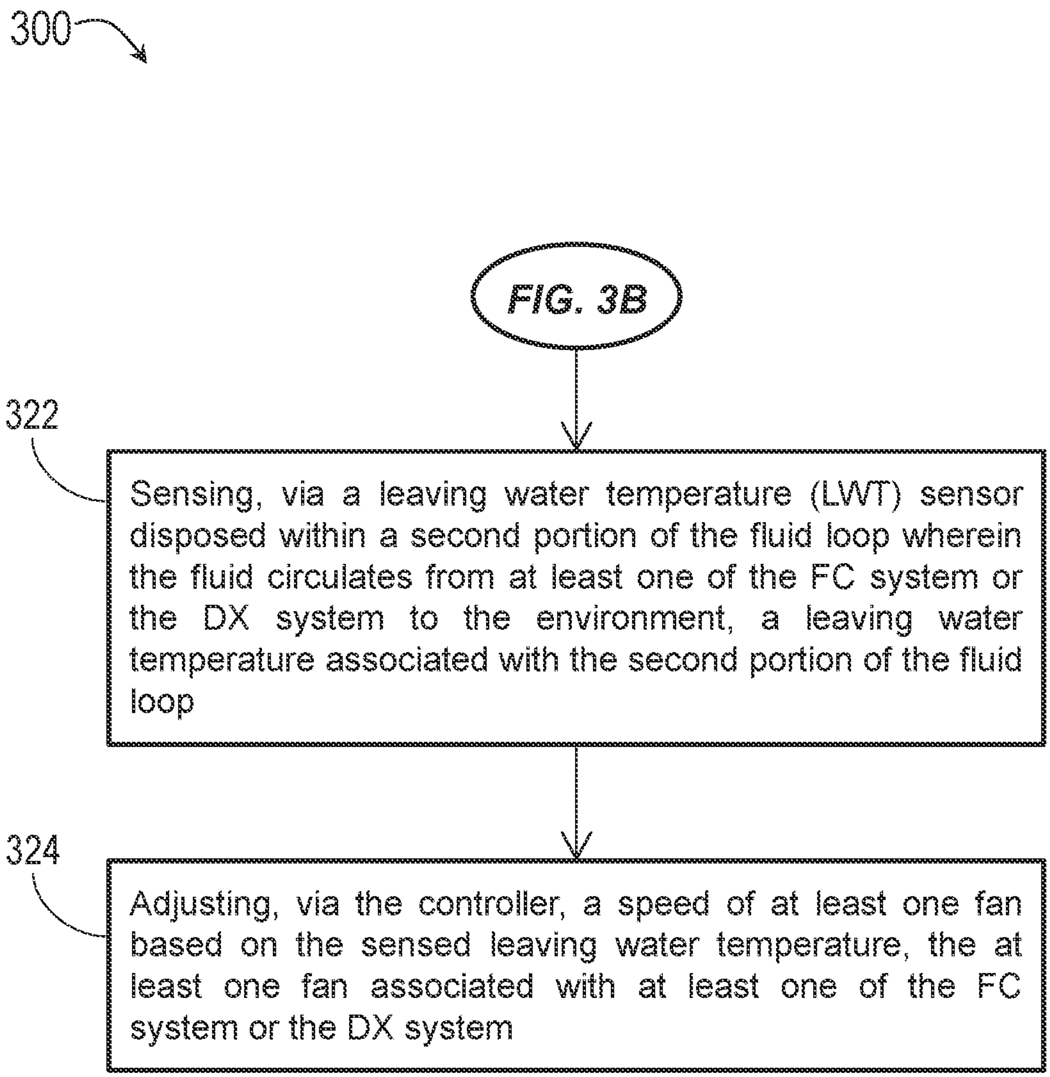

Referring now to FIG. 3C, the method 300 may include additional steps 322 and 324. At the step 322, a leaving water temperature (LWT) sensor in the water loop (e.g., in the second or leaving portion thereof) senses a leaving water temperature of chilled water or fluid leaving the DX and/or FC systems and circulating to the enclosed environment.

At a step 324, the controller adjusts a speed of one or more fans serving the DX and/or FC systems based on the received leaving water temperature. For example, if the LWT is insufficiently cool, the controller may increase the speed or one or more fans for improved air circulation.

CONCLUSION

It is contemplated that embodiments of the inventive concepts disclosed herein may have numerous advantages. For example, the automatic engagement of time-based safe mode when either of the RWT or AMB sensors fail may preserve uninterrupted cooling functionality in an energy efficient fashion, without resorting to full-time mechanical cooling.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be implemented, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

Those having skill in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found ir data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively “associated” such that the desired functionality is achieved. Hence, any two components herein combined to achieve a particular functionality can be seen as “associated with” each other such that the desired functionality is achieved, irrespective of architectures or intermedial components. Likewise, any two components so associated can also be viewed as being “operably connected”, or “operably coupled”, to each other to achieve the desired functionality, and any two components capable of being so associated can also be viewed as being “operably couplable”, to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims.

We claim:

1. A controller device for a chiller system, comprising:

at least one memory configured for storing:

processor-executable encoded instructions;

at least one freecooling threshold;

and one or more configuration time parameters;

one or more processors operatively coupled to the memory and to a chiller system for regulating at least one of a temperature or a humidity level of an enclosed environment, the chiller system comprising:

a fluid loop capable of circulating a fluid between the chiller system and the enclosed environment;

a direct refrigeration (DX) system configured for cooling the fluid loop, the one or more processors configured to activate the DX system when the chiller system is in a mechanical mode;

and a freecooling (FC) system configured for cooling the fluid loop, the one or more processors configured to activate the FC system when the chiller system is in a freecooling mode;

wherein the one or more processors are configured to:

receive an ambient temperature sensed by an ambient temperature sensor external to the environment;

receive a return water temperature (RWT) sensed by an RWT sensor disposed in the fluid loop, the RWT associated with the fluid returning to the chiller system from the environment via the fluid loop;

determine a delta between the ambient temperature and the RWT;

when the delta meets or exceeds the freecooling threshold, activate the freecooling mode;

detect a failure mode in at least one of the ambient temperature sensor or the RWT sensor;

when the failure mode is detected, transition the chiller system to a safe mode;

while the safe mode is engaged, activate at least one of the FC system or the DX system according to the one or more configuration time parameters.

2. The controller device of claim 1, wherein the freecooling mode is a hybrid mode wherein the one or more processors are configured to operate the DX system and the FC system simultaneously.

3. The controller device of claim 1, wherein the one or more configuration time parameters provide for one or more activation cycles, each activation cycle comprising:

an activation of the FC system for X minutes, wherein X is a positive number;

followed by an activation of the DX system for Y minutes, wherein Y is a positive number.

4. The controller device of claim 3, wherein X is greater than Y.

5. The controller device of claim 4, wherein X is an integer multiple of Y.

6. The controller device of claim 1, wherein:

the RWT sensor is disposed within a first portion of the fluid loop wherein the fluid circulates from the enclosed environment to the FC system or the DX system;

and wherein the one or more processors are configured to:

receive a leaving water temperature (LWT) sensed by an LWT sensor, the LWT sensor disposed within a second portion of the fluid loop wherein the fluid circulates from the FC system or the DX system to the enclosed environment;

and adjust a speed of at least one fan based on the received LWT, the at least one fan associated with at least one of the FC system or the DX system.

7. The controller device of claim 1, further comprising:

a control interface configured for:

receiving control input from a user;

and setting the at least one configuration time parameter based on the received control input.

8. The controller device of claim 7, wherein the control interface is configured to display to the user one or more of a system parameter or a system setting associated with at least one of the FC system or the DX system, the system parameter including the at least one configuration time parameter.

9. A multi-mode chiller unit for removing heat from an environment, comprising:

a fluid loop configured for circulating a fluid between the chiller unit and an environment to be cooled;

a freecooling (FC) system comprising:

at least one heat exchanger proximate to the fluid loop and configured for chilling the fluid loop via proximity to a chilled first refrigerant;

at least one FC pump configured for circulating the first refrigerant between the at least one heat exchanger and one or more FC coils;

a direct refrigeration (DX) system comprising a refrigeration circuit configured for circulating a second refrigerant between at least one of an evaporator proximate to the fluid loop, a compressor, and one or more condenser coils, the DX system configured for chilling the fluid loop via proximity to the chilled second refrigerant;

one or more fans configured for chilling at least one of the first refrigerant, the second refrigerant, or the fluid loop by directing air through one or more of the FC coils, the condenser coils, or the fluid loop;

an ambient temperature sensor configured to determine an ambient temperature external to the environment;

a return water temperature (RWT) sensor disposed within a first portion of the fluid loop wherein the fluid circulates from the environment to at least one of the FC system or the DX system, the RWT sensor configured to determine a return water temperature associated with the fluid returning from the environment via the fluid loop;

and a controller operatively coupled to the FC system and to the DX system, the controller including one or more processors configurable via encoded instructions for:

receiving the return water temperature from the RWT sensor;

receiving the ambient temperature from the ambient temperature sensor;

determining a delta between the return water temperature and the ambient temperature;

activating the FC system when the determined delta meets or exceeds a threshold level;

detecting a failure state in at least one of the RWT sensor or the ambient temperature sensor;

and when the failure state is detected, engaging a safe mode by activating at least one of the FC system or the DX system according to at least one configuration time parameter.

10. The multi-mode chiller unit of claim 9, comprising:

at least one leaving water temperature (LWT) sensor disposed within a second portion of the fluid loop wherein the fluid circulates from at least one of the FC system or the DX system to the environment, the LWT sensor configured to sense a leaving water temperature associated with the fluid loop;

and wherein the controller is configured to adjust a speed of the at least one fan based on the sensed leaving water temperature.

11. The multi-mode chiller unit of claim 9, wherein the freecooling mode is a hybrid mode wherein the controller is configured to operate the DX system and the FC system simultaneously.

12. The multi-mode chiller unit of claim 9, wherein the at least one configuration time parameter provides for one or more activation cycles, each activation cycle comprising:

an activation of the FC system for X minutes, wherein X is a positive number;

followed by an activation of the DX system for Y minutes, wherein Y is a positive number.

13. The multi-mode chiller unit of claim 11, wherein X is greater than Y.

14. The multi-mode chiller unit of claim 12, wherein X is an integer multiple of Y.

15. The multi-mode chiller unit of claim 9, further comprising:

a control interface operatively coupled to the controller, the control interface configured for:

receiving control input from a user;

and setting the at least one configuration time parameter based on the received control input;

wherein the control interface is configured to display to the user one or more of a system parameter or a system setting associated with at least one of the FC system or the DX system, the system parameter including the at least one configuration time parameter.

16. A method for multi-mode temperature regulation within an environment, the method comprising:

providing a chiller system comprising a freecooling (FC) system and a direct refrigeration (DX) system configured for regulating the temperature of an environment, a controller operatively coupled to the FC system and the DX system, and a control interface operatively coupled to the controller, the FC system, the DX system, and the environment connected by a fluid loop;

circulating, via the fluid loop, a fluid between at least one of the FC system or the DX system and the environment;

receiving, via the control interface, at least one configuration time parameter provided by a user;

sensing, via an ambient temperature sensor external to the environment, an ambient temperature;

sensing, via a return water temperature (RWT) sensor in a first portion of the fluid loop wherein the fluid circulates from environment to at least one of the FC system or the DX system, a return water temperature associated with the first portion of the fluid loop;

determining, via the controller, a delta between the ambient temperature and the return water temperature;

when the delta meets or exceeds a predetermined threshold level, activating the FC system;

detecting, via the controller, a failure state in at least one of the ambient temperature sensor or the RWT sensor;

engaging a safe mode of the chiller system;

while the safe mode is engaged, activating, via the controller, at least one of the FC system or the DX system according to the at least one configuration time parameter.

17. The method of claim 16, wherein activating, via the controller, at least one of the FC system or the DX system according to the at least one configuration time parameter includes:

executing, via the chiller system, one or more activation cycles, each activation cycle comprising:

an activation of the FC system for X minutes, wherein X is a positive number;

followed by an activation of the DX system for Y minutes, wherein Y is a positive number.

18. The method of claim 16, wherein activating, via the controller, at least one of the FC system or the DX system according to the at least one configuration time parameter includes:

activating a hybrid mode wherein the controller is configured to operate the DX system and the FC system simultaneously.

19. The method of claim 16, wherein X is at least one of greater than Y and an integer multiple of Y.

20. The method of claim 16, further comprising:

sensing, via a leaving water temperature (LWT) sensor disposed within a second portion of the fluid loop wherein the fluid circulates from at least one of the FC system or the DX system to the environment, a leaving water temperature associated with the second portion of the fluid loop;

and adjusting, via the controller, a speed of at least one fan based on the sensed leaving water temperature, the at least one fan associated with at least one of the FC system or the DX system.

* * * * *